US012463177B2

(12) United States Patent
Yan (10) Patent No.: US 12,463,177 B2
(45) Date of Patent: Nov. 4, 2025

(54) HYBRID WAFER BONDING METHOD AND STRUCTURE THEREOF

(71) Applicant: Yangtze Memory Technologies Co., Ltd., Wuhan (CN)

(72) Inventor: Meng Yan, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 455 days.

(21) Appl. No.: 17/958,764

(22) Filed: Oct. 3, 2022

(65) Prior Publication Data
US 2023/0027015 A1     Jan. 26, 2023

Related U.S. Application Data

(63) Continuation of application No. 16/892,993, filed on Jun. 4, 2020, now Pat. No. 11,502,058, which is a
(Continued)

(51) Int. Cl.
*H01L 23/00* (2006.01)
*H01L 21/768* (2006.01)
(Continued)

(52) U.S. Cl.
CPC ........ *H01L 24/94* (2013.01); *H01L 21/76864* (2013.01); *H01L 23/53238* (2013.01); *H01L 23/5384* (2013.01)

(58) Field of Classification Search
CPC ......... H01L 21/76816; H01L 21/76864; H01L 24/94; H01L 24/05
See application file for complete search history.

(56) References Cited

U.S. PATENT DOCUMENTS 8,482,132 B2 *  7/2013  Yang ................. H01L 24/80
                                                257/777
9,054,109 B2    6/2015  Lin
(Continued)

FOREIGN PATENT DOCUMENTS

CN    102593087 A    7/2012
CN    103794584 A    5/2014
(Continued)

OTHER PUBLICATIONS

The World Intellectual Property Organization (WIPO) ; International Search Report for PCT/CN2020/075482 Nov. 24, 2020 ; 5 Pages.
(Continued)

*Primary Examiner* — Zandra V Smith
*Assistant Examiner* — John M Parker
(74) *Attorney, Agent, or Firm* — Oblon, McClelland, Maier & Neustadt, L.L.P.

(57) ABSTRACT

A semiconductor structure includes a first semiconductor structure and a second semiconductor structure. The first semiconductor structure includes a first via structure in a first dielectric layer, the first via structure including a first contact via surface. At least a portion of the first via structure is in direct contact with the first dielectric layer. The second semiconductor structure includes a second via structure in a second dielectric layer, the second via structure including a second contact via surface. At least a portion of the second via structure is in direct contact with the second dielectric layer. The first contact via surface is bonded with the second contact via surface. The second contact via surface and the first contact via surface have an overlapping interface in the vertical direction. A first barrier layer is formed at a nonoverlapping interface in the first contact via surface and the
(Continued)

second contact via surface. The first barrier layer contains a multi-component oxide.

17 Claims, 7 Drawing Sheets

Related U.S. Application Data continuation of application No. PCT/CN2020/075482, filed on Feb. 17, 2020.

(51) Int. Cl.
*H01L 23/532* (2006.01)
*H01L 23/538* (2006.01)

(56) References Cited

U.S. PATENT DOCUMENTS

| | | |
|---|---|---|
| 2013/0207271 A1 | 8/2013 | Hagimoto |
| 2014/0117546 A1 | 5/2014 | Liu |
| 2015/0021789 A1 | 1/2015 | Lin |
| 2016/0126136 A1 | 5/2016 | Ashidate et al. |
| 2017/0358553 A1 | 12/2017 | Kim |
| 2018/0005977 A1 | 1/2018 | Lin |
| 2019/0109042 A1 | 4/2019 | Katkar et al. |
| 2021/0098360 A1 | 4/2021 | Chandhok |
| 2021/0098387 A1 | 4/2021 | Naylor |

FOREIGN PATENT DOCUMENTS

| | | |
|---|---|---|
| CN | 105575930 A | 5/2016 |
| CN | 107492538 A | 12/2017 |
| CN | 109155301 A | 1/2019 |
| CN | 208433368 U | 1/2019 |
| CN | 110690202 A | 1/2020 |

OTHER PUBLICATIONS

Extended European Search Report issued on Apr. 8, 2025 in the corresponding European Patent Application No. 25153347.7, 9 pages.

\* cited by examiner

HYBRID WAFER BONDING METHOD AND STRUCTURE THEREOF

CROSS-REFERENCE TO RELATED APPLICATION

This application is a continuation of U.S. patent application Ser. No. 16/892,993, filed on Jun. 4, 2020, which is a continuation of International Application No. PCT/CN2020/075482, filed on Feb. 17, 2020, the entire content of which is incorporated herein by reference.

FIELD OF THE TECHNOLOGY

This application relates to the field of wafer bonding technologies and, more particularly, to a hybrid wafer bonding method and a structure thereof.

BACKGROUND OF THE DISCLOSURE

In a hybrid wafer bonding process, semiconductor structures having contact vias may be bonded together. However, the contact vias often have different sizes. This may result in interactions between a surface portion of a contact via of one semiconductor structure and a dielectric layer of the other semiconductor structure. For example, copper in the contact via may diffuse into the dielectric layer and degrade the quality of bonded wafers.

Conventional solutions for blocking metal diffusion include depositing a metal blocking layer on the bonding surface of each wafer. The metal blocking layer and the dielectric layer are made of different materials. When forming the contact via, an etch process may be performed on the metal blocking layer and the dielectric layer. Due to different etching rates, gaps may be formed between the metal blocking layer and the dielectric layer. Consequently, defects may occur in the contact via.

The disclosed methods and structures are directed to solve one or more problems set forth above and other problems.

SUMMARY

One aspect of the present disclosure includes a hybrid wafer bonding method. The method includes providing a first semiconductor structure and providing a second semiconductor. The first semiconductor structure includes a first substrate, a first dielectric layer formed on the first substrate, and a first via structure formed in the first dielectric layer and on the first substrate. The first via structure includes a first contact via and first metal impurities doped in the first contact via, the first contact via having a first contact via surface. The second semiconductor structure includes a second substrate, a second dielectric layer formed on the second substrate, and a second via structure formed in the second dielectric layer and on the second substrate. The second via structure includes a second contact via and second metal impurities doped in the second contact via, the second contact via having a second contact via surface. The method further includes bonding the first semiconductor structure with the second semiconductor structure by attaching the first contact via surface with the second contact via surface, wherein the second contact via surface and the first contact via surface have different surface areas and have an overlapped interface; and forming a self-barrier layer on a non-overlapped surface of one or more of the first and second contact via surfaces by an alloying process between the first semiconductor structure and the second semiconductor structure, wherein the self-barrier layer is formed by a multi-component oxide corresponding to the first and second metal impurities.

Another aspect of the present disclosure includes a hybrid wafer bonding structure including a first semiconductor structure, a second semiconductor structure, and a self-barrier layer. The first semiconductor structure includes a first substrate, a first dielectric layer formed on the first substrate, and a first via structure formed in the first dielectric layer and on the first substrate, the first contact via having a first contact surface. The second semiconductor structure includes a second substrate, a second dielectric layer formed on the second substrate, and a second via structure formed in the second dielectric layer and on the second substrate, the second contact via having a second contact via surface. The first semiconductor structure is bonded with the second semiconductor structure, the first contact via surface is attached with the second contact via surface, and the second contact via surface and the first contact via surface have different surface areas and have an overlapped interface. The self-barrier layer is formed on a non-overlapped surface of one or more of the first and second contact via surfaces at a bonding interface between the first and second semiconductor structures, wherein the self-barrier layer contains a multi-component oxide.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DESCRIPTION OF EMBODIMENTS

The following describes the technical solutions in the embodiments of the present invention with reference to the accompanying drawings. Wherever possible, the same reference numbers will be used throughout the drawings to refer to the same or like parts. Apparently, the described embodiments are merely some but not all the embodiments of the present invention. Other embodiments obtained by a person skilled in the art based on the embodiments of the present invention without creative efforts shall fall within the protection scope of the present disclosure.

The hybrid wafer bonding method includes providing a first semiconductor structure and a second semiconductor structure, and bonding the first semiconductor structure with the second semiconductor structure to form a self-barrier layer that contains a multi-component oxide.

Figure 1:
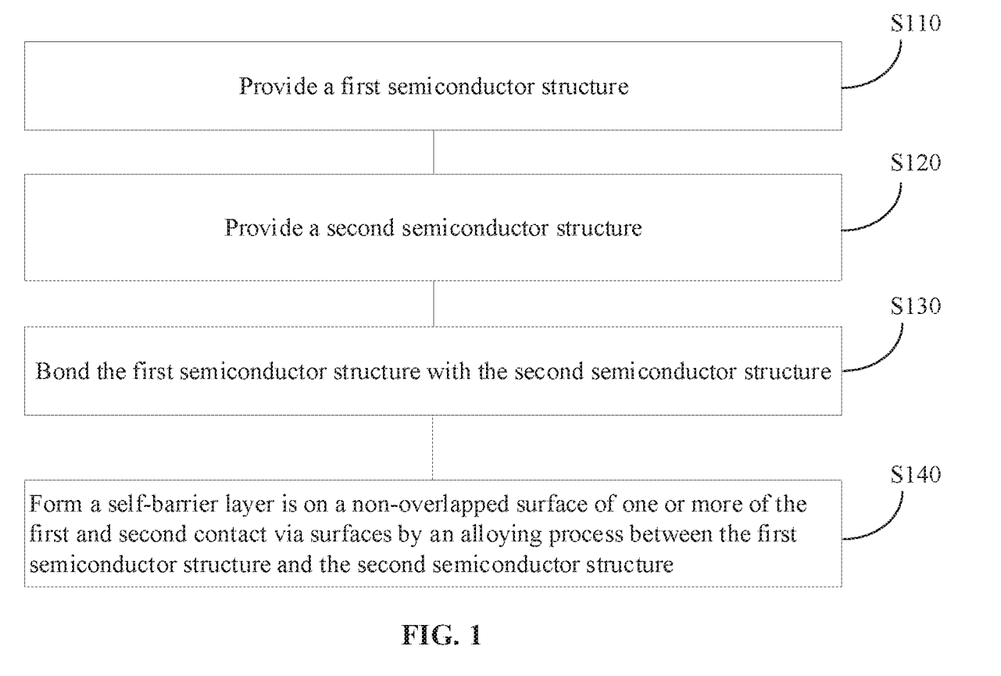
FIG. 1 illustrates an exemplary hybrid wafer bonding method according to various embodiments of the present disclosure.

FIG. 1 illustrates a flowchart of an exemplary hybrid wafer bonding method according to various embodiments of the present disclosure. Corresponding structures are illustrated in FIGS. 2-5.

In S110 of FIG. 1, a first semiconductor structure is provided. The first semiconductor structure may include a first substrate, a first dielectric layer formed on the first substrate, and a first via structure formed in the first dielectric layer and on the first substrate. A corresponding structure is shown in FIG. 2 as an example.

Figure 2:
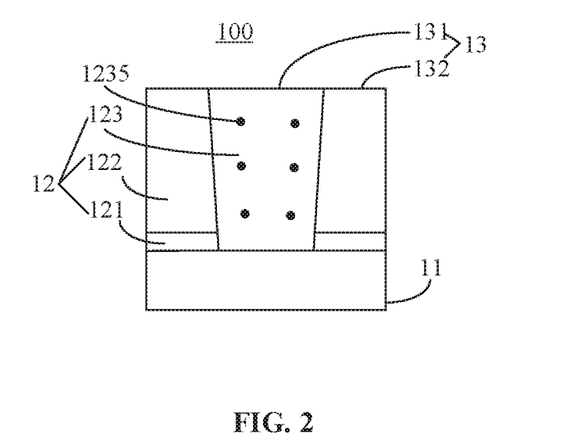
FIG. 2 illustrates an exemplary first semiconductor structure according to various embodiments of the present disclosure.

Referring to FIG. 2, a first semiconductor structure 100 includes a first substrate 11, a first dielectric layer 122 formed on the first substrate 11, and a first via structure 123 formed in the first dielectric layer 122 and on the first substrate 11.

The first substrate 11 may include a dielectric material, such as silicon oxide. Alternatively, the first substrate 11 may include any other suitable materials.

Referring to FIG. 2, the first semiconductor structure 100 may further include a first barrier film 121 on the first substrate 11. A first combination structure 12 may include a first barrier film 121, the first dielectric layer 122 on the first barrier film 121, and the first via structure 123 surrounded by the first dielectric layer 122 and the first barrier film 121.

The first barrier film 121 may be a barrier film including a barrier material that blocks copper from diffusing, such as silicon nitride or nitrogen-doped silicon carbide (NDC), or any suitable material that blocks copper from diffusing.

The first dielectric layer 122 may be a dielectric layer including a dielectric material, such as silicon oxide.

In some embodiments, referring to FIG. 2, the first via structure 123 may be a via that contain copper and metal impurities 1235. That is, the first via structure 123 may be a via that contains metal impurity-doped copper. A via may include conducting metal such as copper and include a portion inside a dielectric layer to form a path for conducting electrical currents.

In some embodiments, the first via structure 123 may be a first contact via that is to be in contact with and bonded with another contact via in the second semiconductor structure.

In some embodiments, the first via structure 123 may include one or more vias.

In some embodiments, the one or more vias may contain copper and metal impurities. The metal impurities may include at least one of Al, Mn, or Ag.

The first combination structure 12 includes a first bonding surface 13. The first bonding surface 13 is a bonding surface that is to be bonded with another bonding surface in a second semiconductor structure for bonding the two surfaces and the two semiconductor structures.

In some embodiments, the first via structure 123 may include or may be a first contact via. The first bonding surface 13 includes a first contact via surface 131 of the first contact via and a first dielectric surface 132 in a same plane. The first contact via surface 131 is a surface of the first via structure 123 at one end of the first via structure 123, and the end of the first via structure 123 is to be bonded with the second semiconductor structure. The first dielectric surface 132 is a surface of the first dielectric layer 122 at one end of the first dielectric layer 122, and the end of the first dielectric layer 122 is to be bonded with the second semiconductor structure. In the orientation shown in FIG. 2, the first contact via surface 131 is a top surface of the first via structure 123, and the first dielectric surface 132 is a top surface of the first dielectric layer 122.

In some embodiments, the first combination structure 12 may include a first barrier film 121, a first dielectric layer 122 on the first barrier film 121, and a first via structure 123, and the first via structure is surrounded by the first dielectric layer 122 and the first barrier film 121 at sides of the first via structure 123. In other embodiments, a first combination structure may include a first dielectric layer and a first via structure, and the first via structure is surrounded by the first dielectric layer at sides of first via structure.

In some embodiments, forming a combination structure such as the first combination structure may include forming a barrier film, forming a dielectric layer, and forming a via in the dielectric layer or the dielectric layer and the barrier film, where the via contains metal impurity-doped copper.

Forming a via containing copper doped with metal impurities (i.e., metal impurity-doped copper) in a dielectric layer such as a first dielectric layer may include forming a contact hole by etching in the dielectric layer, depositing a barrier layer on an inner surface of the contact hole, filling copper with metal impurities over the barrier layer in the contact hole to form the via. The barrier layer may be deposited on the inner surface of the contact hole to block copper from diffusing through the inner surface of the contact hole to the dielectric layer. The barrier layer may contain a barrier material that can block copper from diffusing, such as Ti, Ta, TiN, TaN, TiSiN or any combination thereof. Filling copper with metal impurities in the contact hole may include depositing a seed layer of metal impurity-doped copper over the barrier layer, electroplating copper in the contact hole, and smoothing a surface for the via and the dielectric layer. Depositing the seed layer of metal impurity-doped copper over the barrier layer may include sputtering a copper target and a target containing the metal impurities to deposit copper and the metal impurities to form the seed layer of metal impurity-doped copper by using a sputtering technique system, such as a magnetron sputtering system. After depositing a seed layer of metal impurity-doped copper over the barrier layer and electroplating copper in the contact hole, excess metal impurity-doped copper and copper may be introduced outside the contact hole, a surface for the via and the dielectric layer may be smoothed to remove the excess metal impurity-doped copper and copper and to obtain a smooth surface. The surface for the via and the dielectric layer may be smoothed by chemical-mechanical planarization (CMP).

In some embodiments, the first via structure 123 may penetrate through the first dielectric layer and the first barrier film in the first combination structure. In other embodiments, a first via structure may not penetrate through the first dielectric layer and the first barrier film in the first combination structure. For example, a bottom of a first via structure may end inside the first dielectric layer.

In S120 of FIG. 1, a second semiconductor structure is provided. The second semiconductor may include a second substrate, a second dielectric layer formed on the second substrate, and a second via structure formed in the second dielectric layer and on the second substrate. A corresponding structure is shown in FIG. 3 as an example.

Figure 3:
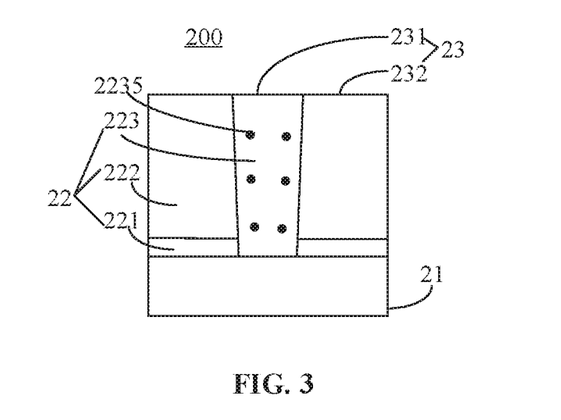
FIG. 3 illustrates an exemplary second semiconductor structure according to various embodiments of the present disclosure.

Referring to FIG. 3, a second semiconductor structure 200 includes a second substrate 21, a second dielectric layer 222 formed on the second substrate 21, and a second via structure 223 formed in the second dielectric layer 222 and on the second substrate 21.

The second substrate 21 may include a dielectric material, such as silicon oxide. Alternatively, the second substrate 21 may include any other suitable materials.

Referring to FIG. 3, the second semiconductor structure may further include a second barrier film 221 on the second substrate 21. A second combination structure 22 may include a second barrier film 221, a second dielectric layer 222 on the second barrier film 221, and a second via structure 223 surrounded by the second dielectric layer 222 and the second barrier film 221.

The second barrier film 221 may be a barrier film including a barrier material that blocks copper from diffusing, such as silicon nitride or NDC, or any suitable material that blocks copper from diffusing.

The second dielectric layer 222 may be a dielectric layer including a dielectric material, such as silicon oxide.

In some embodiments, referring to FIG. 3, the second via structure 223 may be a via that contain copper and metal impurities 2235. That is, the second via structure 223 may be a via that contains metal impurity-doped copper. A via may include conducting metal such as copper and include a portion inside a dielectric layer to form a path for conducting electrical currents.

In some embodiments, the second via structure 223 may be a second contact via that is to be in contact with and bonded with the first contact via in the first semiconductor structure.

In some embodiments, the second via structure 223 may include one or more vias.

In some embodiments, the one or more vias may contain copper and metal impurities. The metal impurities may include at least one of Al, Mn, or Ag.

The second combination structure 22 includes a second bonding surface 23. The second bonding surface 23 is a bonding surface that is to be bonded with a first bonding surface in the first semiconductor structure for bonding the two surfaces and the two wafers In some embodiments, the second via structure 223 may include or may be a second contact via. The second bonding surface 23 includes a second contact via surface 231 of the second contact via and a second dielectric surface 232 in a same plane. The second contact via surface 231 is a surface of the second via structure 223 at one end of the second via structure 223, the end of the second via structure 223 is to be bonded with the first semiconductor structure. The second dielectric surface 232 is a surface of the second dielectric layer 222 at one end of the second dielectric layer 222, and the end of the second dielectric layer 222 is to be bonded with the first semiconductor structure. In the orientation shown in FIG. 3, the second contact via surface 231 is a top surface of the second via structure 223, and the second dielectric surface 232 is a top surface of the second dielectric layer 222.

In some embodiments, the second combination structure 22 may include a second barrier film 221, a second dielectric layer 222 on the second barrier film 221, and a second via structure 223; and the second via structure 223 is surrounded by the second dielectric layer 222 and the second barrier film 221 at sides of the second via structure 223. In other embodiments, a second combination structure may include a second dielectric layer and a second via structure; and the second via structure is surrounded by the second dielectric layer at sides of the second via structure.

Forming the second combination structure is same as or similar to forming the first combination structure. In some embodiments, forming a combination structure such as the second combination structure may include forming a barrier layer, forming a dielectric layer, and forming a via containing metal impurity-doped copper in the dielectric layer or in the dielectric layer and the barrier layer. References can be made to the above descriptions for forming the first combination structure.

In some embodiments, the second via structure 223 may penetrate through the second dielectric layer and the second barrier film in the second combination structure. In other embodiments, a second via structure may not penetrate through the second dielectric layer and the second barrier film in the second combination structure. For example, a bottom of the second via structure may end inside the second dielectric layer.

In some embodiments, the first contact via surface 131 may have a larger bonding area than the second contact via surface 231, and may cover the area of the second contact via surface 231 when the first contact via surface 131 and the second contact via surface 231 are bonded. In other words, the first contact via surface 131 may be a bonding surface of the first via structure 123, and the second contact via surface 231 may be a bonding surface of the second via structure 223, and the first contact via surface 131 may be larger than the second contact via surface 231.

In some embodiments, the first contact via surface 131 may have a larger area than the second contact via surface 231. The one or more vias in the first via structure 123 may contain copper and metal impurities. The one or more vias in the second via structure 223 may contain copper or contain copper and metal impurities.

Figure 4:
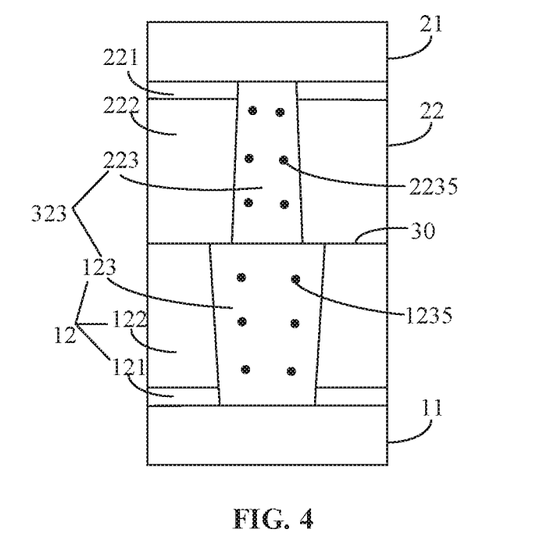
FIG. 4 illustrates an exemplary structure of hybrid wafer bonding according to various embodiments of the present disclosure.
Figure 5:
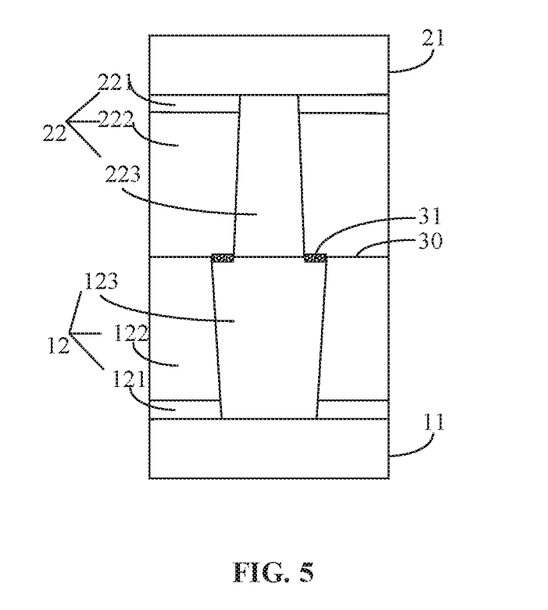
FIG. 5 illustrates another exemplary structure of hybrid wafer bonding according to various embodiments of the present disclosure.

FIG. 4 illustrates a schematic structural diagram of an exemplary structure of hybrid wafer bonding according to various embodiments of the present disclosure. FIG. 5 illustrates a schematic structural diagram of another exemplary structure of hybrid wafer bonding according to various embodiments of the present disclosure.

In S130 of FIG. 1, the first semiconductor structure is bonded with the second semiconductor structure by attaching the first contact via surface with the second contact via surface, where the second contact via surface and the first contact via surface have different surface areas and have an overlapped interface. A corresponding structure is shown in FIG. 4 as an example.

Referring to FIG. 4, the first semiconductor structure is bonded with the second semiconductor structure by attaching the first contact via surface with the second contact via surface, where the second contact via surface and the first contact via surface have different surface areas and have an overlapped interface.

In some embodiments, the first semiconductor structure and the second semiconductor structure may be oriented such that the first bonding surface 13 and the second bonding surface 23 face toward each other. For example, the second semiconductor structure may be oriented upside down such that the second bonding surface is oriented downward to face toward the first bonding surface that is facing upward.

The first semiconductor structure and the second semiconductor structure may be oriented in various manners, as long as the second bonding surface and the first bonding surface face toward each other. For example, the first semiconductor structure may be oriented upside down such that the first bonding surface is oriented downward, and the second semiconductor structure may be oriented such that the second bonding surface faces upward. Accordingly, the first bonding surface and the second bonding surface oriented toward each other.

Further, the first bonding surface and the second bonding surface are in direct contact with each other and bonded together. Referring to FIG. 4, the second semiconductor structure is upside down, and the first semiconductor structure and the second semiconductor structure are bonded together. The first dielectric layer 122 is integrated with the second dielectric layer 222. The first via structure 123 is integrated with the second via structure 223 to form an integrated via structure 323.

A bonding interface 30 is the interface formed at the location where the first bonding surface is in contact with the second bonding surface as the two semiconductor structures are bonded.

The first via structure 123 and the second via structure 223 are conductive. An electrically conductive path is formed from the bottom to the top of the integrated via structure 323.

In S140 of FIG. 1, a self-barrier layer is formed on a non-overlapped surface of one or more of the first and second contact via surfaces by an alloying process between the first semiconductor structure and the second semiconductor structure, where the self-barrier layer is formed by multi-component oxides corresponding to the metal impurities. A corresponding structure is shown in FIG. 5 as an example.

Referring to FIG. 5, a self-barrier layer 31 is formed on a non-overlapped surface of one or more of the first and second contact via surfaces by an alloying process between the first semiconductor structure and the second semiconductor structure. The self-barrier layer contains a multi-component oxide and blocks copper from diffusing to the dielectric layers.

In some embodiments, the alloying process between the first semiconductor structure and the second semiconductor structure may include annealing the first semiconductor structure and the second semiconductor structure to diffuse the metal impurities to the bonding interface to form the self-barrier layer that contains a multi-component oxide. The metal impurities may react with oxides at the interface to form the multi-component oxide. The self-barrier layer that contains the multi-component oxide that blocks copper from diffusing to the dielectric layers, i.e., the first dielectric layer and the second dielectric layer.

In some embodiments, the alloying process may further include applying a pressure on one or more of the first semiconductor structure and the second semiconductor structure.

The self-barrier layer 31 is on a non-overlapped surface of one or more of the first and second contact via surfaces. The self-barrier layer 31 corresponds to an orthogonal projection region at the bonding interface 30, referred to as a "self-barrier region." The self-barrier region is an orthogonal projection of the self-barrier layer 31 on the plane of the bonding interface 30. The self-barrier region includes sub-regions that are within the first contact via surface and outside the second contact via surface and sub-regions that are outside the first contact via surface and within the second contact via surface.

The self-barrier layer 31 contains the multi-component oxide that is formed by the oxide and one or more metal impurities in the bonded wafers, and hence eliminates the need to perform an extra deposition process for depositing a barrier layer at the bonding interface 30.

In the exemplary scenarios that the first contact via surface covers the second contact via surface, sub-regions that are outside the first contact via surface and within the second contact via surface do not exist and the self-barrier region includes sub-regions that are within the first contact via surface and outside the second contact via surface.

The self-barrier layer 31 may contain one or more multi-component oxides. During the annealing process, the metal impurities in the first via structure and/or the second via structure may diffuse to the self-barrier region. Further, the metal impurities may react with the oxide in the dielectric layers at the bonding interface 30, e.g., the oxide in the second dielectric layer, to form a multi-component oxide in the self-barrier layer 31.

The metal impurities in the vias may be at least one of Al, Mn, or Ag. The multi-component oxide may contain Si, O, and the at least one of Al, Mn, or Ag.

In some embodiments, the metal impurities may be Al, and the oxide may be silicon oxide, and the multi-component oxide may contain Al, Si, and O, such as $Si_{x1}Al_{y1}O_{z1}$ (i.e., silicon aluminum oxide), where x1, y1, and z1 are suitable numbers.

In some embodiments, the metal impurities may be Mn, and the oxide may be silicon oxide, and the multi-component oxide may contain Mn, Si, and O, such as $Si_{x2}Mn_{y2}O_{z2}$, where x2, y2, and z2 are suitable numbers.

In some embodiments, the metal impurities may be Ag, and the oxide may be silicon oxide, and the multi-component oxide may contain Ag, Si, and O, such as $Si_{x3}Ag_{y3}O_{z3}$, where x3, y3, and z3 are suitable numbers.

In some embodiments, annealing the first semiconductor structure and the second semiconductor structure may include increasing the temperature of the first semiconductor structure and the second semiconductor structure and decreasing the temperature of the first semiconductor structure and the second semiconductor structure.

In some embodiments, annealing the first semiconductor structure and the second semiconductor structure may include increasing the temperature of the first semiconductor structure and the second semiconductor structure and decreasing slowly the temperature of the first semiconductor structure and the second semiconductor structure.

In some embodiments, annealing the first semiconductor structure and the second semiconductor structure may include increasing the temperature of the first semiconductor structure and the second semiconductor structure from an original temperature value to a predetermined temperature value, keeping the temperature of the first semiconductor structure and the second semiconductor structure at the predetermined temperature value for a predetermined time interval, and decreasing the temperature of the first semiconductor structure and the second semiconductor structure to the original temperature value. The original temperature value may be a temperature value of room temperature.

The predetermined temperature value may be, for example, about 350° C. The predetermined time interval may be, for example, approximately 120 minutes. That is, the temperature of the first semiconductor structure and the second semiconductor structure may be, for example, increased from an original temperature value to about 350° C., and kept at about 350° C. for approximately 120 minutes, and decreased to the original temperature value.

In some embodiments, annealing the first semiconductor structure and the second semiconductor structure may include increasing the temperature of the first semiconductor structure and the second semiconductor structure from an original temperature value to a predetermined temperature value, keeping the temperature of the first semiconductor structure and the second semiconductor structure at the predetermined temperature value for a predetermined time interval, and decreasing the temperature of the first semiconductor structure and the second semiconductor structure to the original temperature value at a temperature reducing speed by using a temperature controller that includes a feedback control system. The predetermined temperature value, the predetermined time interval for keeping at the predetermined temperature value, and/or the temperature reducing speed may be determined according to properties associated with the multi-component oxide, the metal impurity, and/or the oxide in the second and first dielectric layers.

The present disclosure provides another exemplary hybrid wafer bonding method.

Figure 6:
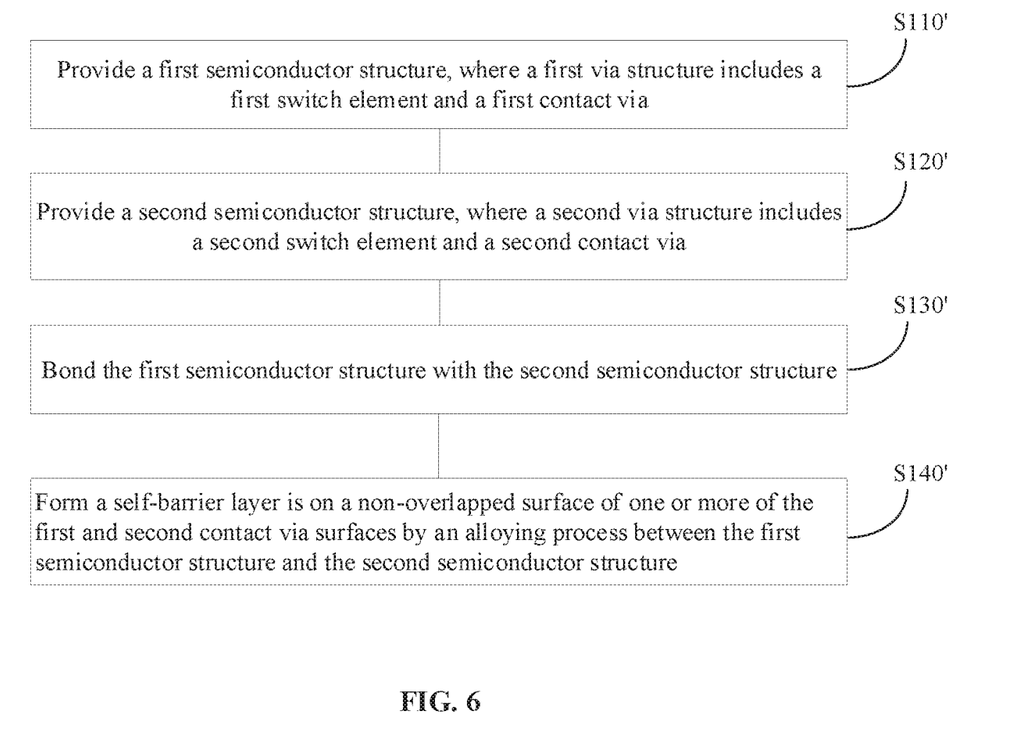
FIG. 6 illustrates another exemplary hybrid wafer bonding method according to various embodiments of the present disclosure.

FIG. 6 illustrates another exemplary hybrid wafer bonding method according to various embodiments of the present disclosure. Corresponding structure are illustrated in FIGS. 7-10. For processes of the exemplary hybrid wafer bonding method illustrated in FIG. 6 including S110', S120', S130', and S140', references can be made to the above descriptions of processes of the one or more exemplary methods such as the method described in connection with FIG. 1, including S110, S120, S130, and S140.

In S110' of FIG. 6, a first semiconductor structure is provided, where a first via structure includes a first switch element and a first contact via. The first semiconductor structure may include a first substrate, a first dielectric layer formed on the first substrate, and a first via structure formed in the first dielectric layer and on the first substrate, where the first via structure may include a first switch element and a first contact via. A corresponding structure is shown in FIG. 7 as an example.

Figure 7:
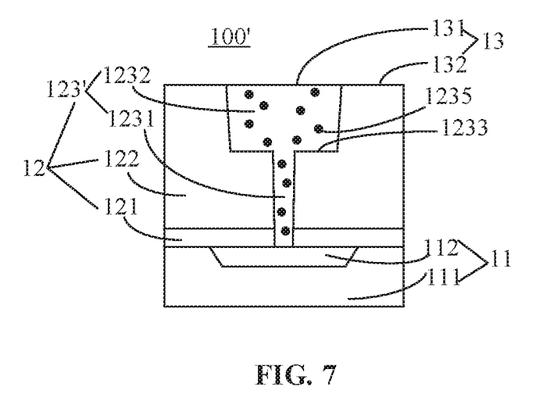
FIG. 7 illustrates another exemplary first semiconductor structure according to various embodiments of the present disclosure.

Referring to FIG. 7, a first semiconductor structure 100' includes a first substrate 11, a first dielectric layer 122 formed on the first substrate 11, and a first via structure 123' formed in the first dielectric layer 122 and on the first substrate 11. The first via structure 123' includes a first switch element 1231 and a first contact via 1232. The first substrate 11 includes an insulating layer 111 and a conducting layer 112. The first semiconductor structure may further include a first barrier film 121 on the first substrate 11.

A first combination structure 12 may include the first via structure 123', the first dielectric layer 122. The first combination structure 12 may further include the first barrier film 121.

The insulating layer 111 may include an insulating material. In some embodiments, the insulating material may be silicon oxide.

In some embodiments, a hole may be formed in the insulating layer 111 by etching and the conductive layer 112 may be formed in the hole. The conductive layer 112 is surrounded by the insulating layer 111 at sides of and a bottom of the conductive layer 112 and has a top exposed from the insulating layer 111.

In some embodiments, the conductive layer 112 may include a metal material such as copper. Further, a barrier layer (not shown in FIG. 7) may be formed between the conductive layer 112 and the insulating layer 111 to block copper in the conductive layer 112 from diffusing into the insulating layer 111. For example, a barrier layer may be deposited on inner surfaces of the hole formed in the insulating layer 111, e.g., an inner wall of the hole formed in the insulating layer 111 and a surface of the hole at one end of the hole, and further the conductive layer 112 is formed over the barrier layer. The barrier layer may contain a barrier material that can block copper from diffusing, such as Ti, Ta, TiN, TaN, TiSiN or any combination thereof.

In some embodiments, referring to FIG. 7, the first barrier film 121 may be a barrier film including a barrier material that blocks copper of the conductive layer 112 from diffusing, such as silicon nitride or NDC, or any suitable material that blocks copper from diffusing.

A first dielectric layer 122 may be formed on the first barrier film 121.

In some embodiments, the first dielectric layer 122 may be a dielectric layer that contains a dielectric material. The dielectric material may be silicon oxide.

A first via structure 123' includes a first switch element 1231 and a first contact via 1232. The first combination structure 12 contains a first bonding surface, and the first switch element 1231 and the first contact via 1232 contain copper and metal impurities.

In some embodiments, a first switch element may be a via that penetrates the first dielectric layer and/or the first barrier film and is in contact with the first substrate. The first switch element may penetrate the first dielectric layer and/or the first barrier film by itself or together with one or more other vias, e.g., together with a first contact via.

A contact hole may be formed in the first barrier film 121 and the first dielectric layer 122 by etching. The contact hole may include a groove on the first substrate and a trench connected to and on the groove. The groove extends from the first dielectric layer 122 to a bottom of the first barrier film 121 to be in contact with the first substrate. The trench is connected to and on the groove. The trench extends from a top of the first dielectric layer 122 to a depth in the first dielectric layer 122. The trench has a larger lateral dimension than the groove.

The first switch element 1231 may be formed in the groove and the first contact via 1232 may be formed in contact with the first switch element 1231 and in the trench. The first switch element 1231 may be formed penetrating the first barrier film 121 between the first substrate 11 and the first dielectric layer 122 and on the conductive layer 112.

An orthogonal projection of the first contact via 1232 on the first substrate 11 is greater than an orthogonal projection of the first switch element 1231 on the first substrate 11 in area.

In some embodiments, a barrier layer may be deposited over inner surfaces of the groove and the trench, e.g., the inner walls of the groove and inner walls and surfaces 1233 of the trench at an end of the trench. The barrier layer may contain a barrier material that can block copper from diffusing, such as Ti, Ta, TiN, TaN, TiSiN or any combination thereof.

Further, a first switch element 1231 is formed in the groove and the first contact via 1232 is formed in the trench by introducing copper doped with metal impurities 1235. The metal impurities 1235 may include at least one of Al, Mn, or Ag. One end of the first switch element 1231 is connected to the first contact via 1232. Another end of the first switch element 1231 is connected to the conductive layer 112.

The first via structure 123' includes the first switch element 1231 and the first contact via 1232. The first combination structure 12 may include the first barrier film 121, the first dielectric layer 122, and the first via structure 123'.

The first combination structure 12 contains the first bonding surface 13. The first bonding surface 13 includes a first contact via surface 131 and a first dielectric surface 132 in a same plane. In some embodiments, the first contact via surface 131 may be a surface of the first contact via 1232 and a surface of the first via structure 123'.

The first contact via surface 131 is a surface of the first via structure 123' at one end of the first via structure 123', and the end of the first via structure 123' is to be bonded with the second semiconductor structure. The first dielectric surface 132 is a surface of the first dielectric layer 122 at one end of the first dielectric layer 122, and the end of the first dielectric layer 122 is to be bonded with the second semiconductor structure. In the orientation shown in FIG. 7, the first contact via surface 131 is a top surface of the first via structure 123' and a top surface of the first contact via 1232, and the first dielectric surface 132 is a top surface of the first dielectric layer 122.

In S120' of FIG. 6, a second semiconductor structure is provided, where a second via structure includes a second switch element and a second contact via. The second semiconductor may include a second substrate, a second dielectric layer formed on the second substrate, and a second via structure formed in the second dielectric layer and on the second substrate, where a second via structure may include a second switch element and a second contact via. A corresponding structure is shown in FIG. 8 as an example.

Figure 8:
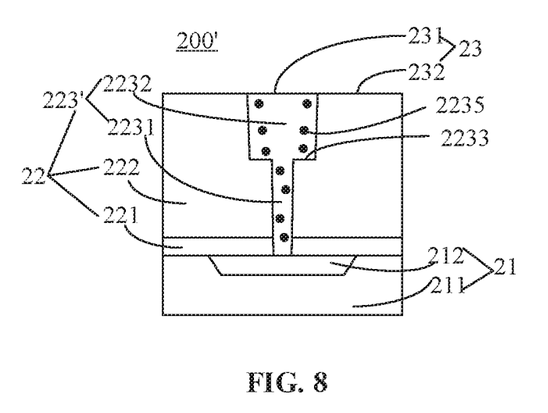
FIG. 8 illustrates another exemplary second semiconductor structure according to various embodiments of the present disclosure.

Referring to FIG. 8, a second semiconductor structure 200' includes a second substrate 21, a second dielectric layer 222 formed on the second substrate 21, and a second via structure 223' formed in the second dielectric layer 222 and on the second substrate 21. The second via structure 223' includes a second switch element 2231 and a second contact via 2232. The second substrate 21 includes an insulating layer 211 and a conducting layer 212. The second semiconductor structure may further include a second barrier film 221 on the second substrate 21.

A second combination structure 22 may include the second via structure 223' and the second dielectric layer 222. The second combination structure 22 may further include the second barrier film 221.

In some embodiments, referring to FIG. 8, the insulating layer 211 may include an insulating material such as silicon oxide.

In some embodiments, a hole may be formed in the insulating layer 211 by etching and the conductive layer 212 may be formed in the hole. The conductive layer 212 is surrounded by the insulating layer 211 at sides of and a bottom of the conductive layer 212 and has a top exposed from the insulating layer 211. The second substrate 21 includes the insulating layer 211 and the conductive layer 212.

In some embodiments, the conductive layer 212 may include a metal material such as copper. Further, a barrier layer (not shown in FIG. 8) may be formed between the conductive layer 212 and the insulating layer 211 to block copper in the conductive layer 212 from diffusing to the insulating layer 211. For example, a barrier layer may be deposited on inner surfaces of the hole formed in the insulating layer 211, e.g., inner walls and an end, e.g., a bottom, of the hole formed in the insulating layer 211, and further the conductive layer 212 is formed over the barrier layer.

A second barrier film 221 may be deposited on the second substrate 21.

In some embodiments, referring to FIG. 8, the second barrier film 221 may be a barrier film including a barrier material that blocks copper in the conductive layer 212 from diffusing, such as silicon nitride or NDC, or any suitable material that blocks copper from diffusing.

A second dielectric layer 222 may be formed on the second barrier film 221.

In some embodiments, the second dielectric layer 222 may be a dielectric layer that contains a dielectric material. The dielectric material may be silicon oxide.

A second via structure 223' includes a second switch element 2231 and a second contact via 2232. The second combination structure 22 contains the second bonding surface 23. The second switch element 2231 and the second contact via 2232 contain copper, or copper and metal impurities 2235.

In some embodiments, a second switch element may be a via that penetrates the second dielectric layer and/or the second barrier film and is in contact with the second substrate. The second switch element may penetrate the second dielectric layer and/or the second barrier film by itself or together with one or more other vias, e.g., together with a second contact via.

A contact hole may be formed in the second barrier film 221 and the second dielectric layer 222 by etching. The contact hole may include a groove on the second substrate 21 and a trench connected to and on the groove. The groove extends from the second dielectric layer 222 to a bottom of the second barrier film 221 to be in contact with the second substrate 21. The trench is connected to and on the groove. The trench extends from a top of the second dielectric layer 222 to a depth in the second dielectric layer 222. The trench has a larger lateral dimension than the groove.

The second switch element 2231 may be formed in the groove and the second contact via 2232 may be formed in contact with the second switch element and in the trench. The second switch element may be formed penetrating the second barrier film between the second substrate and the second dielectric layer and on the conductive layer In some embodiments, a barrier layer may be deposited over inner surfaces of the groove and the trench, e.g., the inner walls of the groove and inner walls and surfaces 2233 of the trench at one end of the trench. The barrier layer may contain a barrier material that can block copper from diffusing, such as Ti, Ta, TiN, TaN, TiSiN or any combination thereof.

Further, a second switch element 2231 is formed in the groove and a second contact via 2232 is formed in the trench by introducing copper doped with metal impurities 2235. The metal impurities may include at least one of Al, Mn, or Ag. One end of the second switch element 2231 is connected to the second contact via 2232. Another end of the second switch element 2231 is connected to the conductive layer 212.

The second via structure 223' includes the second switch element 2231 and the second contact via 2232. The second combination structure 22 includes the second barrier film 221, the second dielectric layer 222, and the second via structure 223'.

The second combination structure 22 contains the second bonding surface 23. The second bonding surface 23 includes a second contact via surface 231 and a second dielectric surface 232 in a same plane. In some embodiments, the second contact via surface 231 may be a surface of the second contact via 2232 and a surface of the second via structure 223'.

The second contact via surface 231 is a surface of the second via structure 223' at one end of the second via structure 223', and the end of the second via structure 223' is to be bonded with the first semiconductor structure. The second dielectric surface 232 is a surface of the second dielectric layer 222 at one end of the second dielectric layer 222, and the end of the second dielectric layer 222 is to be bonded with the first semiconductor structure. In the orientation shown in FIG. 8, the second contact via surface 231 is a top surface of the second via structure 223' and a top surface of the second contact via 2232, and the second dielectric surface 232 is a top surface of the second dielectric layer 222.

In some embodiments, the first contact via surface 131 has a larger area than the second contact via surface 231.

In S130' of FIG. 6, the first semiconductor structure is bonded with the second semiconductor structure by attaching the first contact via surface with the second contact via surface, where the second contact via surface and the first contact via surface have different surface areas and have an overlapped interface. A corresponding structure is shown in FIG. 9 as an example.

Figure 9:
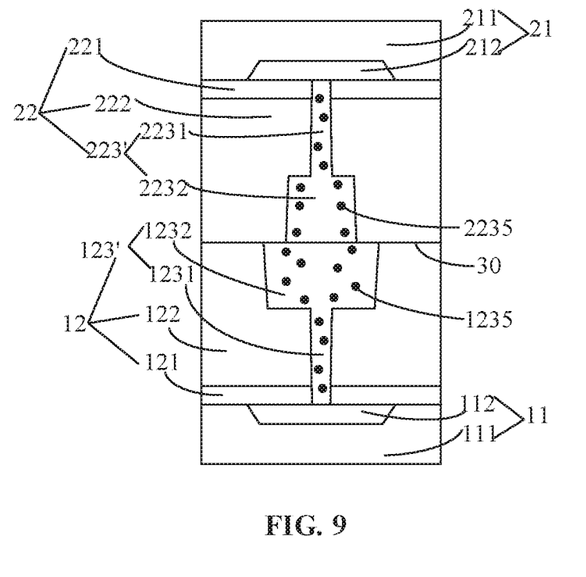
FIG. 9 illustrates another structure of hybrid wafer bonding according to various embodiments of the present disclosure.

Referring to FIG. 9, the first semiconductor structure is bonded with the second semiconductor structure by attaching the first contact via surface with the second contact via surface, where the second contact via surface and the first contact via surface have different surface areas and have an overlapped interface. The second semiconductor structure is arranged upside down as compared to the orientation of the second semiconductor structure in FIG. 8, and the first semiconductor structure and the second semiconductor structure are bonded together. The first dielectric layer 122 is integrated with the second dielectric layer 222, and the first via structure 123' is integrated with the second via structure 223' to form an integrated via structure.

The first via structure 123' and the second via structure 223' are conductive. Thus, the conductive layer 112 is electrically connected to the conductive layer 212 by the first via structure 123' and the second via structure 223'. That is, the conductive layer 112 is electrically connected to the conductive layer 212 by an electrically conductive path that includes the first switch element 1231, the first contact via 1232, the second contact via 2232, and the second switch element 2231.

A bonding interface 30 is the interface formed at the location where the first bonding surface is in contact with the second bonding surface as the two semiconductor structures are bonded.

In S140' of FIG. 6, a self-barrier layer is formed on a non-overlapped surface of one or more of the first and second contact via surfaces by an alloying process between the first semiconductor structure and the second semiconductor structure, where the self-barrier layer is formed by one or more multi-component oxides corresponding to the metal impurities. A corresponding structure is shown in FIG. 10 as an example.

Figure 10:
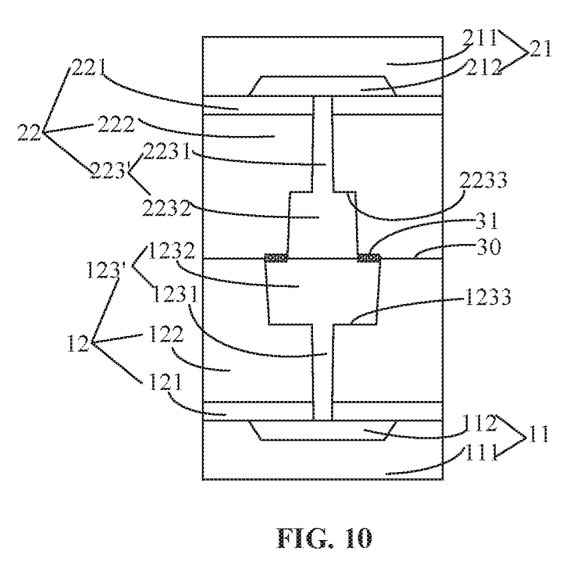
FIG. 10 illustrates another structure of hybrid wafer bonding according to various embodiments of the present disclosure.

Referring to FIG. 10, a self-barrier layer 31 is formed on a non-overlapped surface of one or more of the first and second contact via surfaces by an alloying process between the first semiconductor structure and the second semiconductor structure. The self-barrier layer contains a multi-component oxide and blocks copper from diffusing to the dielectric layers.

In some embodiments, the alloying process between the first semiconductor structure and the second semiconductor structure may include annealing the first semiconductor structure and the second semiconductor structure to diffuse the metal impurities to the bonding interface to form the self-barrier layer that contains a multi-component oxide. The metal impurities may react with the oxide at the interface to form the multi-component oxide. The self-barrier layer that contains the multi-component oxide blocks copper from diffusing to the dielectric layers, i.e., the first dielectric layer and the second dielectric layer.

In some embodiments, the alloying process may further include applying a pressure on one or more of the first semiconductor structure and the second semiconductor structure.

Referring to FIG. 10, the self-barrier layer 31 is formed in a region at the bonding interface 30. The self-barrier layer 31 corresponds to an orthogonal projection region at the bonding interface, referred to as a "self-barrier region." The self-barrier region is an orthogonal projection of the self-barrier layer 31 on the plane of the bonding interface 30. The self-barrier region includes sub-regions that are within the first contact via surface and outside the second contact via surface and sub-regions that are outside the first contact via surface and within the second contact via surface.

The self-barrier layer 31 may contain one or more multi-component oxides. During the annealing process, the metal impurities in the first via structure and/or the second via structure may diffuse to the self-barrier region. Further, the metal impurities may react with the oxide in the dielectric layers at the bonding interface 30, e.g., the oxide in the second dielectric layer, to form a multi-component oxide.

The multi-component oxide may contain Si, O, and at least one of Al, Mn, or Ag.

In some embodiments, the metal impurities may be Al, and the oxide may be silicon oxide, and the multi-component oxide may contain Al, Si, and O, such as $Si_{x1}Al_{y1}O_{z1}$, where x1, y1, and z1 are suitable numbers.

In some embodiments, the metal impurities may be Mn, and the oxide may be silicon oxide, and the multi-component oxide may contain Mn, Si, and O, such as $Si_{y2}Mn_{y2}O_{z2}$, where x2, y2, and z2 are suitable numbers.

In some embodiments, the metal impurities may be Ag, and the oxide may be silicon oxide, and the multi-component oxide may contain Ag, Si, and O, such as $Si_{x3}Ag_{y3}O_{z3}$, where x3, y3, and z3 are suitable numbers.

The present disclosure provides a wafer structure of hybrid bonding. The structure contains bonded semiconductor structures and a self-barrier layer that contains a multi-component oxide and blocks copper from diffusing to a dielectric layer in the structure.

FIG. 5 illustrates an exemplary structure of hybrid wafer bonding.

The structure of hybrid wafer bonding includes a first semiconductor structure, a second semiconductor structure, and a self-barrier layer.

Specifically, the structure of hybrid wafer bonding includes a first substrate 11, a first combination structure 12 on the first substrate, a second combination structure 22 on the first combination structure 12, and a second substrate 21 on the second combination structure 22, a bonding interface 30, and a self-barrier layer 31. The bonding interface 30 is formed at the boundary where the second combination structure 22 and the first combination structure are in contact with each other.

The first combination structure 12 includes a first barrier film 121 on the first substrate 11, a first dielectric layer 122 on the first barrier film 121, and a first via structure 123 surrounded by the first dielectric layer 122 and the first barrier film 121.

In some embodiments, the first via structure 123 may include a via. A via may include conducting metal such as copper and include portions inside a dielectric layer to form a path for conducting electrical currents.

Referring to FIG. 5, the second combination structure 22 includes a second dielectric layer 222, a second barrier film 221 on the second dielectric layer 222, a second via structure 223 surrounded by the second dielectric layer 222 and the second barrier film 221.

The first via structure 123 includes a first contact via surface that is at one end of the first via structure 123 and the end of the first via structure 123 is bonded with the second semiconductor structure. The second via structure 223 includes a second contact via surface that is a surface of the second via structure 223 at one end of the second via structure 223 and the end of the second via structure 223 is bonded with the first semiconductor structure.

The self-barrier layer 31 is formed in a region at the bonding interface 30. The self-barrier layer 31 corresponds to an orthogonal projection region at the bonding interface 30, referred to as a "self-barrier region." The self-barrier region is an orthogonal projection of the self-barrier layer 31 on the plane of the bonding interface 30. The self-barrier region may include sub-regions that are within the first contact via surface and outside the second contact via surface and sub-regions that are outside the first contact via surface and within the second contact via surface.

For the exemplary structure of hybrid wafer bonding, references can be made to the descriptions for method embodiments.

The self-barrier layer 31 may contain one or more multi-component oxides. During the annealing process, the metal impurities in the first via structure and/or the second via structure may diffuse to the self-barrier region. Further, the metal impurities may react with the oxide in the dielectric layer at the bonding interface 30, e.g., the oxide in the second dielectric layer, to form a multi-component oxide in the self-barrier layer 31.

The metal impurities in the vias may be at least one of Al, Mn, or Ag. The multi-component oxide may contain Si, O, and the at least one of Al, Mn, or Ag. For example, the metal impurities in the vias may be Al, and the oxide may be silicon oxide, and the multi-component oxide may contain Al, Si and O, such as $Si_{x1}Al_{y1}O_{z1}$, where x1, y1, and z1 are suitable numbers.

The self-barrier layer 31 that contains a multi-component oxide and blocks copper from diffusing to the dielectric layers across the bonding interface 30. Barrier layers deposited over the inner surfaces of the contact holes in the first dielectric layer 122 and the second dielectric layer 222, such as the inner walls of the contact holes in the first dielectric layer 122 and the second dielectric layer 222, may block copper from diffusing to the dielectric layers through the inner surfaces of the contact holes.

The present disclosure provides another structure of hybrid wafer bonding. The structure may include bonded semiconductor structure and a self-barrier layer that contains a multi-component oxide and blocks copper from diffusing to the dielectric layer.

FIG. 10 illustrates another structure of hybrid wafer bonding according to various embodiments of the present disclosure.

The structure of hybrid wafer bonding includes a first semiconductor structure, a second semiconductor structure, and a self-barrier layer.

Specifically, the structure of hybrid wafer bonding includes a first substrate 11, a first combination structure 12 on the first substrate, a second combination structure 22 on the first combination structure 12, and a second substrate 21 on the second combination structure 22, a bonding interface 30, and a self-barrier layer 31. The bonding interface 30 is formed at the boundary where the second combination structure 22 and the first combination structure 12 are in contact with each other.

The first substrate 11 includes an insulating layer 111 and a conductive layer 112 in the insulating layer 111. The conductive layer 112 is surrounded by the insulating layer 111 at sides of and a bottom of the conductive layer 112 and has a top exposed from the insulating layer 111.

The first combination structure 12 includes a first barrier film 121 on the first substrate 11, a first dielectric layer 122 on the first barrier film 121, and a first via structure 123' surrounded by the first dielectric layer 122 and the first barrier film 121.

The first via structure 123' includes a first switch element 1231 and a first contact via 1232 in contact with one end of the first switch element 1231. The first switch element 1231 has another end in contact with the conductive layer 112. A via may include conducting metal such as copper and include portions inside a dielectric layer to form a path for conducting electrical currents.

The second combination structure 22 includes a second dielectric layer 222, a second barrier film 221 on the second dielectric layer 222, and a second via structure 223' surrounded by the second dielectric layer 222 and the second barrier film 221.

The second via structure 223' includes a second contact via 2232 and a second switch element 2231 having one end in contact with the second contact via 2232. The second switch element 2231 has another end in contact with the conductive layer 212 of the second substrate 21.

The first via structure 123' includes a first contact via surface that is a surface of the first via structure 123' at one end of the first via structure 123' and the end of the first via structure 123' is bonded with the second semiconductor structure. The second via structure 223' includes a second contact via surface that is a surface of the second via structure 223' at one end of the second via structure 223' and the end of the second via structure 223' is bonded with the first semiconductor structure.

The self-barrier layer 31 is formed in a region at the bonding interface 30. The self-barrier layer 31 corresponds to an orthogonal projection region at the bonding interface 30, referred to as a "self-barrier region." The self-barrier region is an orthogonal projection of the self-barrier layer 31 on the plane of the bonding interface 30. The self-barrier region includes sub-regions that are within the first contact via surface and outside the second contact via surface and sub-regions that are outside the first contact via surface and within the second contact via surface.

For the self-barrier region, references can be made to the descriptions for method embodiments.

The self-barrier layer 31 may contain one or more multi-component oxides. During the annealing process, the metal impurities in the first via structure and/or the second via structure may diffuse to the self-barrier region. Further, the metal impurities may react with the oxide in the dielectric layer at the bonding interface 30, e.g., the oxide in the second dielectric layer, to form a multi-component oxide in the self-barrier layer 31.

The metal impurities in the vias may be at least one of Al, Mn, or Ag. The multi-component oxide may contain Si, O, and the least one of Al, Mn, or Ag. For example, the metal impurities may be Al, and the oxide may be silicon oxide, and the multi-component oxide may contain Al, Si, and O, such as $Si_{x1}Al_{y1}O_{z1}$, where x1, y1, and z1 are suitable numbers.

The self-barrier layer 31 contains a multi-component oxide and blocks copper from diffusing to the dielectric layers. Barrier layers deposited over the inner surfaces of the contact holes in the first dielectric layer 122 and the second dielectric layer 222 can block copper from diffusing to the dielectric layers through the inner surfaces of the contact holes.

In some embodiments, the inner surfaces of the contact hole in the first dielectric layer 122 and the first barrier film 121 may include the inner walls and the surfaces 1233 of the contact hole in the first dielectric layer 122. The contact hole may include a groove on the first substrate and a trench connected to and on the groove. The surfaces 1233 of the contact hole in the first dielectric layer 122 is at one end of the trench and is outside the groove laterally. The end of the trench is closer to the groove in the first dielectric layer 122 than the bonding interface 30.

In some embodiments, the inner surfaces of the contact hole in the second dielectric layer 222 and the second barrier film 221 may include the inner walls and the surfaces 2233 of the contact hole in the second dielectric layer 222. The contact hole may include a groove on the second substrate and a trench connected to and on the groove. The surfaces 2233 of the contact hole in the second dielectric layer 222 is at one end of the trench and is outside the groove laterally. The end of the trench is closer to the groove in the second dielectric layer 222 than the bonding interface 30.

In some embodiments, the self-barrier layer 31 may block copper from diffusing through the bonding interface 30 to the dielectric layers including the integrated first dielectric layer 122 and second dielectric layer 222. Diffusion of copper through the bonding interface is prevented without the need to deposit barrier layers on the bonding surfaces.

In some embodiments, barrier layers deposited on the inner surfaces of the contact holes in the dielectric layers may block copper from diffusing through the inner surfaces of the contact holes to the dielectric layers. The barrier layer may contain a barrier material that can block copper from diffusing, such as Ti, Ta, TiN, TaN, TiSiN or any combination thereof.

In some embodiments, the conductive layer 112 and the conductive layer 212 may contain copper. The first barrier film 121 may block copper in the conductive layer 112 from diffusing to the dielectric layers including the integrated first dielectric layer 122 and second dielectric layer 222. Barrier layers (not shown in FIG. 10) may be deposited in the hole in the insulating layer 111 and further the conductive layer is formed in the hole over the barrier layers to fill the hole. Barrier layers may block copper in the conductive layer 112 from diffusing to the insulating layer 111 through the sides and the end of the conductive layer 112 facing the insulating layer 111. The barrier layer may contain a barrier material that can block copper from diffusing, such as Ti, Ta, TiN, TaN, TiSiN or any combination thereof.

The second barrier film 221 may block copper in the conductive layer 212 from diffusing to the dielectric layers including the integrated first dielectric layer 122 and second dielectric layer 222. Barrier layers (not shown in FIG. 10) may be deposited over the hole in the insulating layer 211 and further the conductive layer 212 is formed in the hole over the barrier layers to fill the hole. The barrier layers may block copper in the conductive layer 212 from diffusing to the insulating layer 211 through the sides and the end of the conductive layer 212 facing the insulating layer 211. The barrier layer may contain a barrier material that can block copper from diffusing, such as Ti, Ta, TiN, TaN, TiSiN or any combination thereof.

The self-barrier region of the self-barrier layer 31 at the bonding interface 30 may have various shapes according to actual application scenarios. The shape of the self-barrier region of the self-barrier layer 31 may vary according to the first contact via surface 131 and the second contact via surface 231. That is, the shape of the self-barrier region may vary according to the via surface of the first semiconductor structure and the via surface of the second semiconductor structure that are bonded together at the bonding interface.

Figure 11:
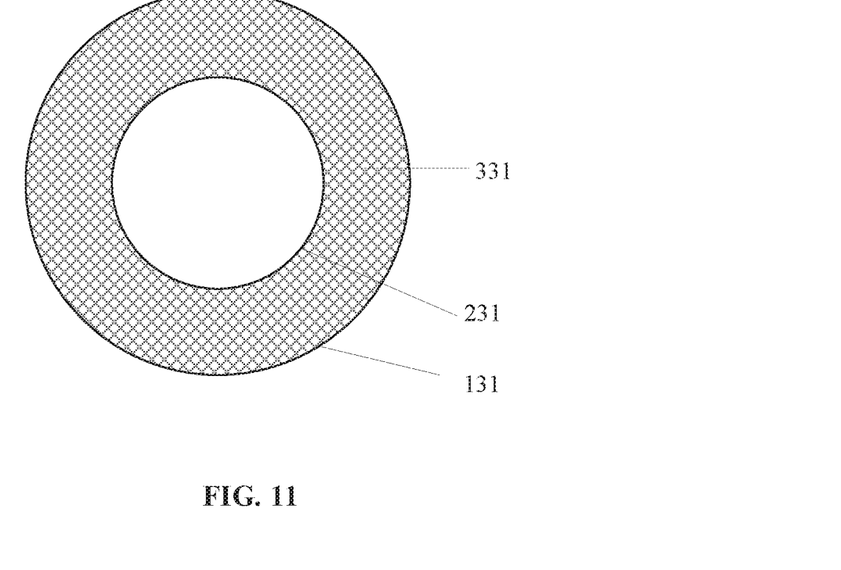
FIG. 11 illustrates an exemplary orthogonal projection region of a self-barrier layer according to various embodiments of the present disclosure.

FIG. 11 illustrates an exemplary orthogonal projection region of self-barrier layer according to various embodiments of the present disclosure.

The orthogonal projection region of self-barrier layer refers to the self-barrier region described in method embodiments.

The first contact via surface 131 has a circle shape. The second contact via surface 231 has a circle shape, and has a smaller area than the first contact via surface 131. The first contact via surface 131 and the second contact via surface 231 are concentric at the bonding interface. The second contact via surface 231 is located within the first contact via surface 131 at the bonding interface. That is, an orthogonal projection of the first contact via surface 131 on the bonding interface completely covers an orthogonal projection of the second contact via surface 231 on the bonding interface.

The self-barrier region 331 is in the hatched area that is inside the first contact via surface 131 and outside the second contact via surface 231. The self-barrier region 331 has an annular shape, where annular ring sizes of the shape have the same value. An annular ring size is a width of self-barrier region 331 in a radial direction pointing from the center of the smaller one of the first and second contact via surfaces, e.g., the second contact via surface 231. The inner circle and the outer circle of the self-barrier region 331 are concentric.

In some embodiments, one or more vias in the first via structure 123 may include metal impurity-doped copper, and one or more vias the second via structure 223 may include copper. During the annealing process, the metal impurities in the one or more vias in the first via structure 123 may diffuse to the bonding interface 30 to react with the oxide in the second dielectric layer to form the self-barrier layer 31 in the self-barrier region 331.

In some embodiments, one or more vias in the first via structure 123 may include metal impurity-doped copper, and one or more vias in the second via structure 223 may include metal impurity-doped copper. During the annealing process, the metal impurities in the one or more vias in the first via structure 123 and the second via structure 223 may diffuse to the bonding interface 30 to react with the oxide in the second dielectric layer to form the self-barrier layer 31 in the self-barrier region 331.

Figure 12:
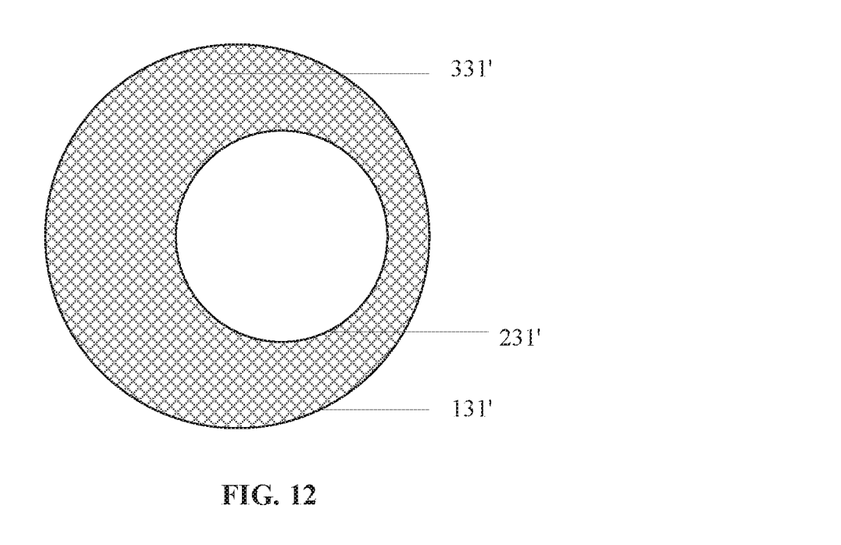
FIG. 12 illustrates another exemplary orthogonal projection region of a self-barrier layer according to various embodiments of the present disclosure.

FIG. 12 illustrates another exemplary orthogonal projection region of self-barrier layer according to various embodiments of the present disclosure.

A first contact via surface 131' has a circle shape. The second contact via surface 231' has a circle shape and has a smaller area than the first contact via surface 131'. The first contact via surface 131' and the second contact via surface 231' are non-concentric at the bonding interfere. That is, the center of the first contact via surface 131' is at a different location with respect to the center of the second contact via surface 231' at the bonding interfere. Further, the second contact via surface 231' is located within the first contact via surface 131' at the bonding interface. That is, an orthogonal projection of the first contact via surface 131' on the bonding interface completely covers an orthogonal projection of the second contact via surface 231' on the bonding interface.

The self-barrier region 331' is in the hatched area that is inside the first contact via surface 131' and outside the second contact via surface 231'. The self-barrier region 331' has an irregular annular shape with annular ring sizes having different values, where a annular ring size is a width of self-barrier region 331' in a radial direction pointing from the center of the smaller one of the first and second contact via surfaces, e.g., the second contact via surface 231'. The inner circle and the outer circle of the self-barrier region 331' are non-concentric.

In some embodiments, one or more vias in the first via structure may include metal impurity-doped copper, and one or more vias the second via structure may include copper. During the annealing process, the metal impurities in the one or more vias in the first via structure may diffuse to the bonding interface to react with the oxide in the second dielectric layer to form the self-barrier layer 31 in the self-barrier region.

In some embodiments, one or more vias in the first via structure may include metal impurity-doped copper, and one or more vias in the second via structure may include metal impurity-doped copper. During the annealing process, the metal impurities in the one or more vias in the first via structure and the second via structure may diffuse to the bonding interface to react with the oxide in the second dielectric layer to form the self-barrier layer 31 in the self-barrier region.

The first contact via surface may have various shapes, such as a circle shape, an ellipse shape, a square shape, a rectangle shape, or any other suitable shape.

The second contact via surface may have various shapes, such as a circle shape, an ellipse shape, a square shape, a rectangle shape, or any other suitable shape.

A center of the first contact via surface and a center of the second contact via surface may be at the same location or at different locations when two semiconductor structures are bonded.

Although the principles and implementations of the present disclosure are described by using specific embodiments in the specification, the foregoing descriptions of the embodiments are only intended to help understand the method and core idea of the method of the present disclosure. Meanwhile, a person of ordinary skill in the art may make modifications to the specific implementations and application range according to the idea of the present disclosure. In conclusion, the content of the specification should not be construed as a limitation to the present disclosure.

What is claimed is:

1. A hybrid wafer bonding structure, comprising:
a first semiconductor structure including:
a first substrate, a first dielectric layer formed on the first substrate, and a first via structure formed in the first dielectric layer and on the first substrate, the first contact via having a first contact via surface;
a second semiconductor structure including:
a second substrate, a second dielectric layer formed on the second substrate, and a second via structure formed in the second dielectric layer and on the second substrate, the second contact via having a second contact via surface, wherein:
the first semiconductor structure is bonded with the second semiconductor structure, the first contact via surface is attached with the second contact via surface, and the second contact via surface and the first contact via surface have different surface areas and have an overlapped interface; and
a self-barrier layer, formed on a non-overlapped surface of one or more of the first and second contact via surfaces at a bonding interface between the first and second semiconductor structures, wherein the self-barrier layer contains a multi-component oxide,
wherein a contact hole in the first dielectric layer includes a first groove on the first substrate and a first trench connected to and on the first groove,
a barrier layer is on an inner surface of the contact hole and a seed layer is on the barrier layer, and
first metal impurity-doped copper is over the seed layer and in the contact hole to form the first via structure, and the first via structure includes a first switch element in the first groove and a first contact via on the first switch element.

2. The hybrid wafer bonding structure according to claim 1, wherein:
each of the first dielectric layer and the second dielectric layer includes silicon oxide, and
the multi-component oxide containing Si, O, and at least one of Al, Mn, or Ag.

3. The hybrid wafer bonding structure according to claim 2, wherein:
the multi-component oxide is silicon aluminum oxide.

4. The hybrid wafer bonding structure according to claim 1, wherein:
an orthogonal projection of one of the second contact via surface and the first contact via surface on the bonding interface completely covers an orthogonal projection of another of the second contact via surface and the first contact via surface.

5. The hybrid wafer bonding structure according to claim 1, wherein:
a barrier film is formed between the first substrate and the first dielectric layer.

6. The hybrid wafer bonding structure according to claim 5, wherein the first switch element penetrates the barrier film.

7. The hybrid wafer bonding structure according to claim 5, wherein the first the barrier film includes silicon nitride.

8. The hybrid wafer bonding structure according to claim 5, wherein the first the barrier film includes nitrogen-doped silicon carbide.

9. The hybrid wafer bonding structure according to claim 1, wherein:
the first semiconductor structure further includes a conductive layer in the first substrate,
the first switch element is formed on the conductive layer, and an orthogonal projection of the first via on the first substrate is greater than an orthogonal projection of the first switch element on the first substrate.

10. The hybrid wafer bonding structure according to claim 9, wherein:
the first semiconductor structure further includes an insulating layer in the first substrate, and the conductive layer is surrounded by the insulating layer.

11. The hybrid wafer bonding structure according to claim 1, wherein:
the barrier layer on the inner surface of the contact hole contains Ti, Ta, TiN, TaN, TiSiN, or any combination thereof.

12. The hybrid wafer bonding structure according to claim 1, wherein the first contact via surface of the first contact via is circular, and the second contact via surface of the second contact via is circular.

13. The hybrid wafer bonding structure according to claim 12, wherein the first contact via surface and the second contact via surface are concentric at the bonding interface.

14. The hybrid wafer bonding structure according to claim 12, wherein the first contact via surface and the second contact via surface are non-concentric at the bonding interface.

15. The hybrid wafer bonding structure according to claim 1, wherein the metal impurity includes aluminum (Al).

16. The hybrid wafer bonding structure according to claim 1, wherein the metal impurity includes manganese (Mn).

17. The hybrid wafer bonding structure according to claim 1, wherein the metal impurity includes silver (Ag).

* * * * *